United States Patent [19]

Goldman et al.

[11] Patent Number: 5,412,324
[45] Date of Patent: May 2, 1995

[54] APPARATUS AND METHOD FOR CALIBRATING ELECTRIC BUS BAR INSULATING COATINGS

[75] Inventors: Ira B. Goldman, Waterbury, Conn.; Louis A. Rosen, Stantonville, Tenn.; Edward J. Marshall, Middletown, Conn.; James E. Fredrickson; Charles L. Young, both of Selmer, Tenn.

[73] Assignee: General Electric Company, New York, N.Y.

[21] Appl. No.: 145,714

[22] Filed: Nov. 4, 1993

[51] Int. Cl.⁶ ............................................. G01R 31/02
[52] U.S. Cl. ................................. 324/551; 324/557; 324/700; 324/71.2
[58] Field of Search ............... 324/551, 557, 699, 700, 324/703, 71.1, 71.2

[56] References Cited

U.S. PATENT DOCUMENTS

| | | |
|---|---|---|
| 3,384,856 | 5/1968 | Fisher ........................... 339/22 |
| 3,583,896 | 6/1971 | Piller ......................... 324/71.1 X |
| 3,849,187 | 11/1974 | Fetscher et al. .................. 117/201 |
| 3,936,738 | 2/1976 | Maltby ............................ 324/71.1 |
| 4,804,804 | 2/1989 | Hibbert et al. ................... 174/16.2 |
| 4,839,580 | 6/1989 | Moore et al. ...................... 324/699 |

*Primary Examiner*—Kenneth A. Wieder
*Assistant Examiner*—Glenn W. Brown
*Attorney, Agent, or Firm*—Richard A. Menelly

[57] ABSTRACT

Electric bus bar insulating coatings are calibrated to withstand long term outdoor exposure without failure. Manufacturing samples of the coating material are evaluated at the coating manufacturing site prior to shipment to the bus bar manufacturer. Bus bar samples coated with the material are suspended within a heated water bath and subjected to several hundred volt-amperes. The thickness of the coating is predetermined to provide accurate qualifying data for each coating sample within a reasonable time frame. Coating compositions that qualify are then applied to electric bus bar conductors by the bus bar manufacturer.

4 Claims, 3 Drawing Sheets

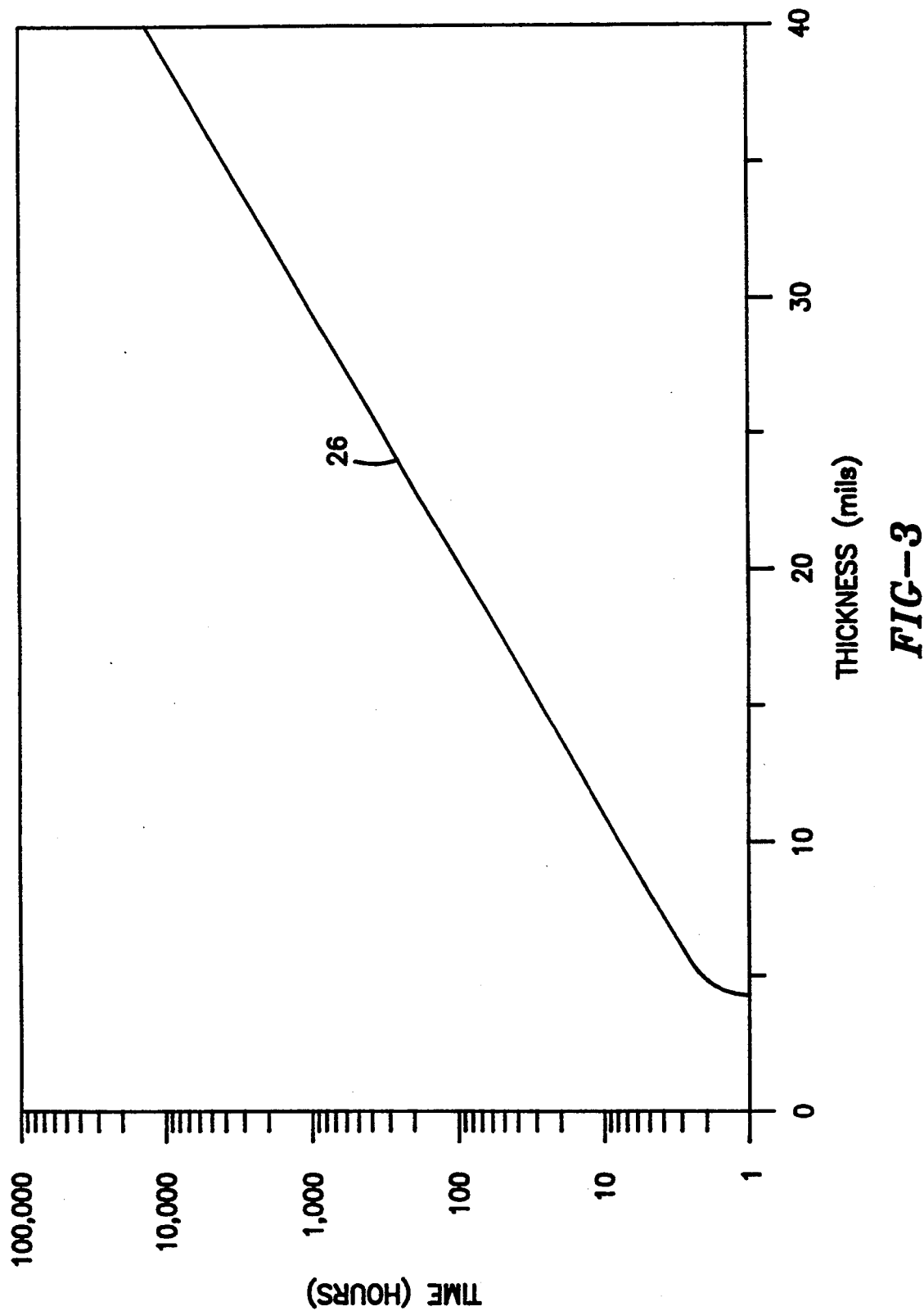

APPARATUS AND METHOD FOR CALIBRATING ELECTRIC BUS BAR INSULATING COATINGS

BACKGROUND OF THE INVENTION

U.S. Pat. No. 3,384,856 entitled "Multiphase Electric Power Distribution System" describes the close attachment of high ampere-rated bus bar conductors by means of insulated bolts and insulative coatings. The close coupling of the bus bars was intended to provide good heat transfer away from the bus bars to the heat-sinking metal support frame. The absence of thermally stable and moisture resistant insulative material prevented the close coupling concept from commercial feasibility until the development of epoxy electrical insulating material. U.S. Pat. No. 4,804,804 entitled "Thermally Efficient Power Busway Housing" describes electric bus bar conductors employing epoxy material as in insulation coating that are bolted together by means of insulated bolts.

The thermal and electrical insulating properties of the epoxy material render the epoxy superior to other plastic resins for bus bar insulation coatings. The tendency of the epoxy to react with moisture is controlled by the addition of proprietary hydrolytic materials to the epoxy composition. However, to insure good long term resistance to extreme moisture conditions, the bus bar manufacture subjects sample epoxy-coated bus bars to extreme water submersion and electrical energizing testing before qualifying the epoxy material for large scale production quantities.

Current practice is to subject representative numbers of sample epoxy-coated bus bars to such "water-test" conditions for at least one thousand hours before qualifying the epoxy material for large scale bus bar insulation. The long tests and evaluation processes involved add to the overall cost of the already expensive epoxy material. It would be economically advantageous to provide a simple short time test for qualifying epoxy material for bus bar insulation coatings.

One purpose of the invention is to describe a simple apparatus and process for qualifying epoxy as an electrical bus bar insulation material in a substantially shortened time frame.

SUMMARY OF THE INVENTION

The invention comprises the application of sample epoxy coatings of predetermined thickness to electric bus bars and subjecting the coated bus bars to a submersion water test while electrically-energized. The controlled thickness provides rapid indication of the hydrolytic stability of the epoxy coating. The epoxy materials which qualify are then produced in large quantities and are shipped to the electric bus bar manufacture within a reasonable time frame.

BRIEF DESCRIPTION OF THE DRAWINGS

FIG. 3 is a graphic representing of the failure profile of epoxy coated bus bars when subjected to the apparatus of FIG. 2.

DESCRIPTION OF THE PREFERRED EMBODIMENT

Figure 1:
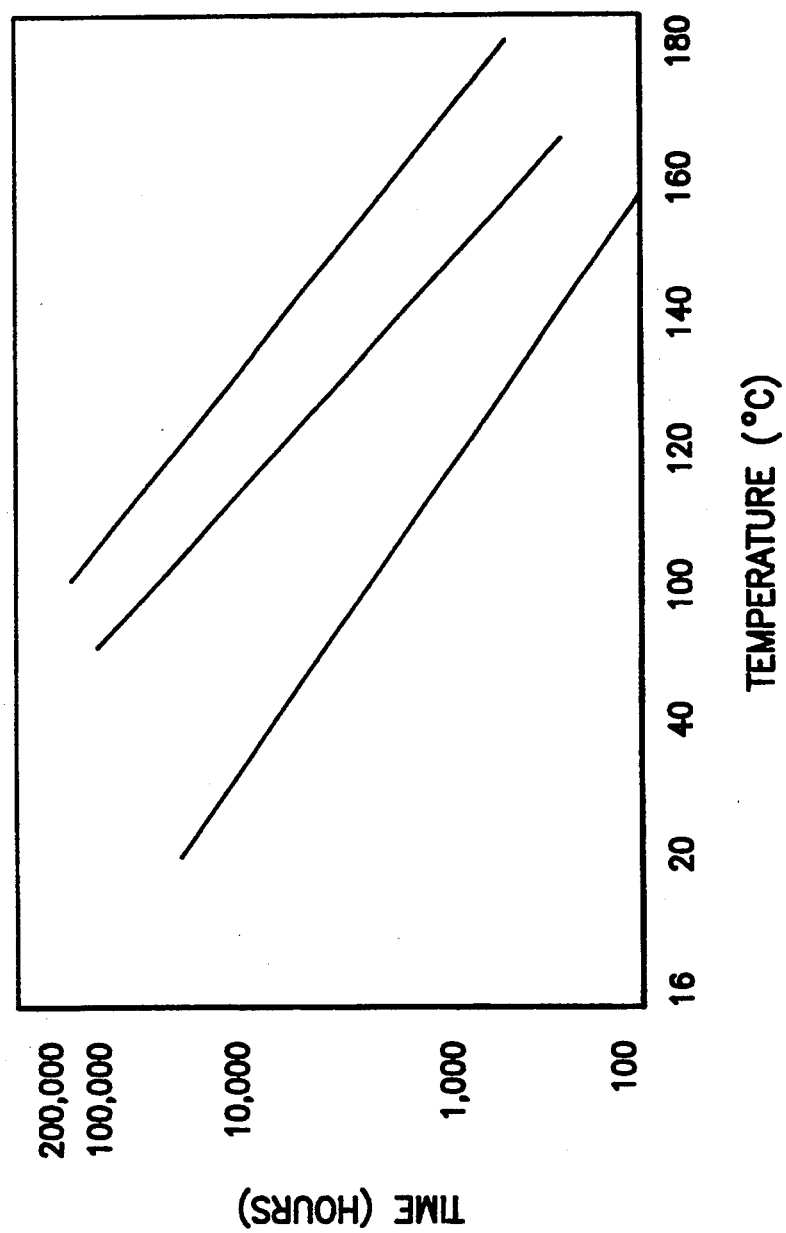
FIG. 1 is a graphic representation of the failure profiles of various plastic electric insulation materials as a function of temperature.

The selection of electrical insulation materials depends greatly on the mechanical strength and environmental resistant properties of the insulation materials as well as the dielectric properties. The Failure Profiles 10, 11, 12 for polyvinyl chloride, mylar and epoxy resins respectively are depicted in FIG. 1. It is readily appreciated that the resins deteriorate at the higher temperatures with epoxy resin exhibiting the best thermal resistance.

Figure 2:
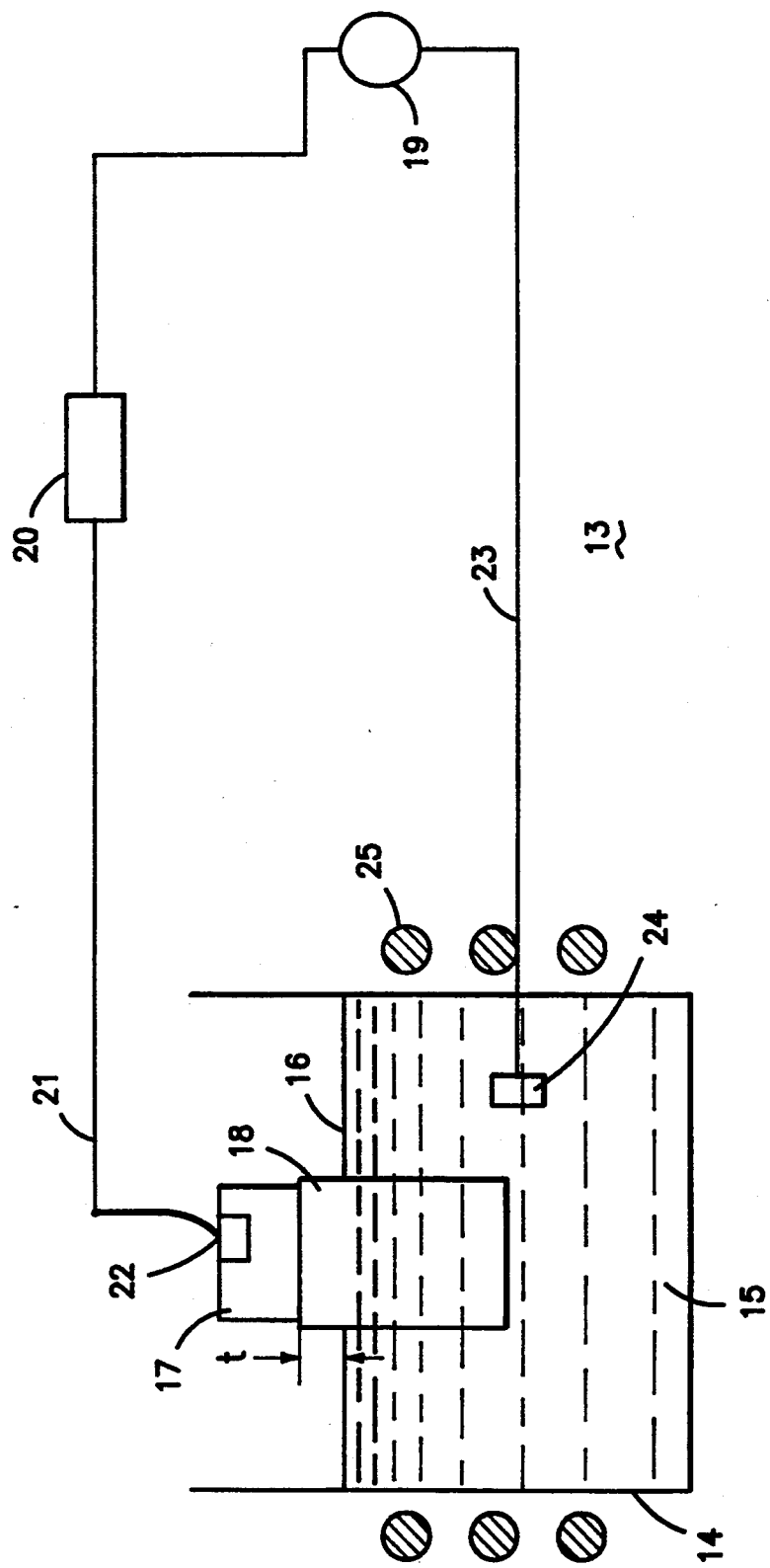
FIG. 2 is a diagrammatic representation of the water test apparatus used to provide the electric bus bar qualification procedure according to the invention.

To determine the reactivity between water and the epoxy resin when an electric conductor is coated with the resin, the water test 13 shown in FIG. 2 is employed. The procedure is similar to that described the *I.E.E.E Journal* 1979, pages 30–34. The vat-sized container 14 is filled with tap water 15 and the sample bus bar 17, with the epoxy coating 18, is submerged in the water with a specified amount of the coating t above the surface of the water as indicated at 16. A current path is maintained through the water by means of the electrode 24 which connects with one terminal of an AC power source 19 through conductor 23. The other terminal connects with the bus bar through a fuse 20, conductor 21 and connector 22. To further accelerate the test failure conditions, the water is maintained at a high temperature by means of the heater coils 25. For bus bars coated to a thickness of 30 mil, failures occurring within 500 to 1000 hours of subjecting the sample to the continuous voltage and thermal stress insure life times of the bus bars in external applications between 20 to 30 years. Failure of the coating by current seepage through the epoxy is indicated by the blowing of the calibrated fuse 20. Heretofore, the epoxy manufacturer would submit sample lots of epoxy material to the bus bar manufacturer for the water test evaluation. Those samples exceeding the 500 hour time frame would then be approved and large production runs would be undertaken. The long time requirements to meet the bus bar manufactures specification prior to approval substantially adds to the epoxy manufacturer's costs and decreases the overall yield.

It was unexpectedly determined that the time frame for evaluation and qualification of the epoxy material could be substantially shortened without sacrificing the critical insulation properties of the epoxy by controlling the thickness of the sample epoxy. The anticipated decrease in the test time is sufficient to allow the water test to be used as a quality procedure on site during the epoxy manufacturing process. Reducing the time frame of the requisite water test without deterring from the predicted actual long term insulation properties of the epoxy material represents a substantial advancement in the electrical insulation industry.

As best seen by referring FIG. 3, the epoxy failure rate 26 in an inverse function of the coating thickness. Accordingly, the thickness of the sample bus bar within the water test of FIG. 2 can be reduced from 1000 hrs for a 30 mil thickness to a reasonable 20–30 hours for a thickness ranging from 10–15 mils. This reduction from over a month of testing to one day has had a substantial positive effect on the epoxy manufactures ability to control the epoxy compositions which ordinarily vary from batch to batch. The failure rate 26 is for a particular epoxy composition including proprietary additives to prevent the reactions that otherwise occur between the epoxy resin composition and water. One such additive is described in U.S. Pat. No. 3,849,187 for epoxy compositions used within the semiconductor industry.

A test procedure has herein been described that allows a short time frame between testing and qualifying epoxy coatings for electric bus bar conductors. The test procedure has become a standard for outdoor electric bus evaluation and qualification requirements.

We claim:

1. Apparatus for determining the time of failure of electric bus insulating coatings comprising:

a water-filled container;

means for heating said water to a predetermined temperature;

means for suspending a plurality of electric bus bars containing insulating coatings of a predetermined thickness in said water;

means for applying a predetermined voltage to said bus bars;

means for applying a predetermined voltage to said water;

circuit interruption means electrically connected with said bus bars providing indication of moisture seepage through said coatings as an indication of the time of failure of said insulating coatings.

2. The apparatus of claim 1 wherein said predetermined thickness corresponds to anticipated failure times for said coatings when said bus bars are electrically energized and exposed to moisture.

3. The apparatus of claim 2 wherein said coatings are selected from the group consisting of polyvinyl chloride, mylar and epoxy.

4. The apparatus of claim 2 wherein said said thickness is between 5 and 25 mils.

* * * * *